US 6,703,902 B2

(12) United States Patent
Jeon et al.

(10) Patent No.: US 6,703,902 B2
(45) Date of Patent: Mar. 9, 2004

(54) PHASE LOCKED LOOP FOR REDUCING ELECTROMAGNETIC INTERFERENCE

(75) Inventors: Phil-Jae Jeon, Osan (KR); Myoung-su Lee, Seoul (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 10/253,072

(22) Filed: Sep. 24, 2002

(65) Prior Publication Data

US 2003/0058053 A1 Mar. 27, 2003

(30) Foreign Application Priority Data

Sep. 25, 2001 (KR) ......................... 2001-59337
Jul. 24, 2002 (KR) ......................... 2002-43695

(51) Int. Cl.$^7$ ............................................. H03L 7/08
(52) U.S. Cl. .......................... 331/17; 331/18; 331/10; 331/25; 327/159
(58) Field of Search ......................... 331/17, 18, 25, 331/10, 34; 327/159, 292; 375/376

(56) References Cited

U.S. PATENT DOCUMENTS

| 5,929,683 | A | 7/1999 | Menkhoff | 327/292 |
|---|---|---|---|---|
| 5,943,382 | A | 8/1999 | Li et al. | 375/376 |
| 6,046,646 | A | 4/2000 | Lo et al. | 331/10 |
| 6,160,456 | A | 12/2000 | Chang | 331/25 |
| 6,175,259 | B1 | 1/2001 | Mann et al. | 327/159 |
| 6,181,213 | B1 | 1/2001 | Chang | 331/34 |
| 6,204,649 | B1 | 3/2001 | Roman | 323/282 |
| 6,208,216 | B1 | 3/2001 | Nasila | 332/110 |
| 6,229,400 | B1 | 5/2001 | McCollough et al. | 331/17 |
| 6,242,956 | B1 | 6/2001 | McCollough et al. | 327/159 |
| 2002/0158694 | A1 * | 10/2002 | Endo et al. | 331/18 |
| 2003/0039330 | A1 * | 2/2003 | Castiglione et al. | 375/376 |

FOREIGN PATENT DOCUMENTS

| JP | 11-220386 | 8/1999 | ............ H03L/7/093 |
|---|---|---|---|
| JP | 00-101424 | 4/2000 | ............ H03L/7/08 |
| JP | 00-216667 | 8/2000 | ............ H03K/3/03 |
| JP | 00-252817 | 9/2000 | ............ H03L/7/093 |
| JP | 2003124805 A * | 4/2003 | ............ H03L/7/08 |

* cited by examiner

Primary Examiner—Robert Pascal
Assistant Examiner—Joseph Chang
(74) Attorney, Agent, or Firm—Mills & Onello LLP

(57) ABSTRACT

A phase locked loop (PLL) for reducing electromagnetic interference (EMI) is provided. The PLL is not sensitive to a manufacturing process, consumes less power, occupies a small layout space, and can flexibly control a modulation frequency and a modulation rate flexibly. The PLL for reducing the EMI controls the signals having a phase difference, which is n-times (where n is an integer) the basic delay time of the output signals from a voltage controlled oscillator (VCO), and determines the modulation rate. Then, the PLL repeats the procedure during the cycle of a predefined modulation frequency. The PLL for reducing the EMI not only reduces the EMI, but also does not require a ROM. Therefore, the layout space can be reduced and broad frequency ranges can be obtained. In addition, since the phase difference of the output signals of the VCO is controlled by logic circuits, the PLL is insensitive to changes in the manufacturing process.

13 Claims, 13 Drawing Sheets

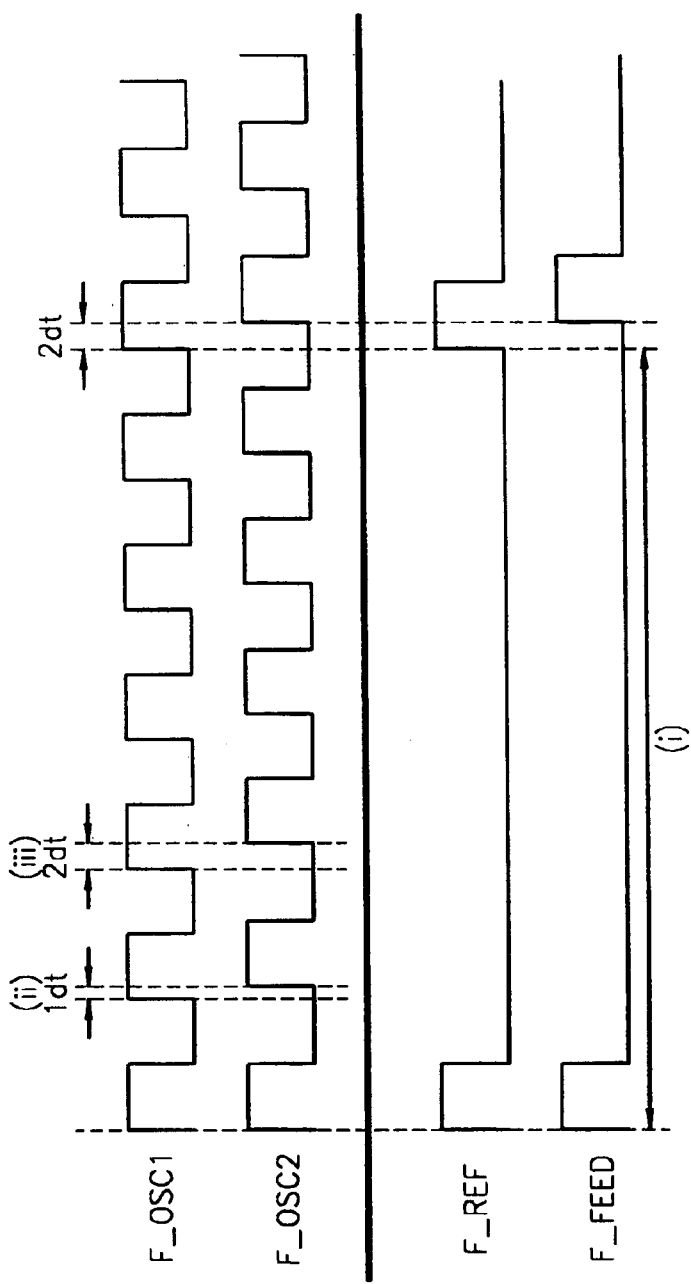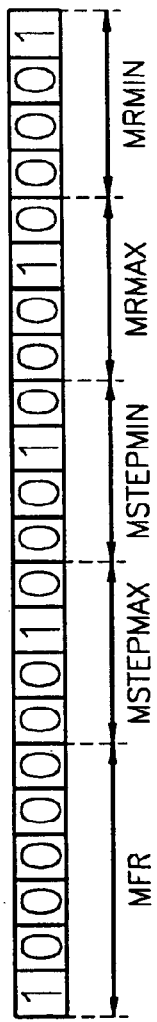
FIG. 14
FIG. 15

PHASE LOCKED LOOP FOR REDUCING ELECTROMAGNETIC INTERFERENCE

BACKGROUND OF THE INVENTION

1. Field of the Invention

The present invention relates to a phase locked loop (PLL), and more particularly, to a PLL for reducing electromagnetic interference (EMI).

2. Description of the Related Art

A phase locked loop (PLL) plays a vital role in reducing electromagnetic interference (EMI) in digital systems. As technology continues to develop, digital systems need to be able to support high speeds and high density. PLLs included in such digital systems are no exception to the high-speed trend. However, the high speeds of the digital systems and the PLL may cause EMI which is generated when the energy of a high frequency signal exceeds a predetermined reference value. In particular, semiconductor devices are very sensitive to EMI.

A simple method of reducing EMI is by modulating the frequency of a reference signal having a high energy, i.e., a high power, at a certain frequency into a frequency signal having a lower energy. For example, if the frequency of the reference signal is 1 MHz, the frequency of the reference signal is modulated to be between 0.99 MHz and 1.01 MHz over a pre-defined repetitive cycle. That is, the frequency of the PLL output signal is modulated into the frequency signal between the maximum frequency and the minimum frequency allowed by the system using the PLL output signal, repeatedly at a pre-defined interval.

FIG. 1 is a graph showing modulation frequency and modulation rate.

With reference to FIG. 1, a frequency-modulated signal varies between a maximum frequency $(1+\delta) F_0$ and a minimum frequency $(1-\delta) F_0$ over an interval of 1/Fm. Here, $F_0$ is the reference frequency. The modulation frequency Fm and the frequency rate $\delta$ can be determined randomly. It is preferable that the modulation frequency Fm be between 30 KHz and 100 KHz and the modulation rate $\delta$ be 4% or less.

FIG. 2 illustrates a modulated signal whose sinusoidal profile is shown in (a) and whose spectrum is shown in (b), a modulated signal whose triangular profile is shown in (c) and whose spectrum is shown in (d), and a modulated signal whose profile, which resembles that of Hershey Kisses as patented by Lexmark, Inc., is shown in (e) and whose spectrum is shown in (f).

In case of the modulated signal profile having the sinusoidal profile of (a), the power is too high at the sides, as shown in (b) to be used. Therefore, the modulated signals having the triangular profile or Hershey Kisses profile are used.

A dithered PLL or a spread spectrum clock generator (SSCG), is a device used to reduce EMI by modulating the frequency and reducing the power gain. The SSCG is the patented technology of Lexmark and is called a dithered PLL. The modulation methods include center spreading, up spreading and down spreading.

FIG. 3 shows the spectrums of the dithered PLL power corresponding to different spreading methods.

FIG. 3 shows reference signals and spectrums in (a), (c), and (e of the signals generated as a result of the modulation of the reference signals and profiles in (b), (d), and (f) of the modulated signals. Graphs (a) and (b) illustrate center spreading, graphs (c) and (d) illustrate up spreading, and graphs (e) and (f) illustrate down spreading.

With reference to FIG. 3, the above 3 spreading methods will be described in detail.

First, in the center spreading method shown in (a) and (b), a reference signal having a narrow frequency range and a high power peak at the center of (a) is modulated into a frequency signal having a broader frequency range and a lower power.

Second, in the up spreading method shown in (c) and (d), a reference signal having a narrow frequency range and a high power peak at the left side of (c) is modulated into a frequency signal having a broader frequency range and a lower power.

Third, in the down spreading method shown in (e) and (f), a reference signal having a narrow frequency range and a high power peak at the right side of (e) is modulated into a frequency signal having a lower frequency range and a lower power.

In the past, two methods were used to perform the above spreading. One was to control the least significant bit (LSB) of a divider, and the other was to carry a sawtooth waveform on the electric potential of a loop filter. For the first method, the SSCG adopting a read only memory (ROM) controller suggested by Hardin of Lexmark Inc. is used. Sigma delta can also be adopted. For the second method, a pulse generator is installed to load a sawtooth wave into the electric potential of the loop filter, which was suggested by Neomagic Inc.

In a case where the ROM controller is used, the above spreading is performed by ROM coding. Therefore, the data of the ROM needs to be newly coded in order to adjust the output frequency ranges. In addition, the ROM occupies too large a space in the semiconductor device. Installing the pulse generator to load a sawtooth wave into the electric potential of the loop filter limits how much the output frequency can be changed. As a result, a device, which is not sensitive to a manufacturing process, consumes less power, occupies a small layout space, and can flexibly control the modulation frequency and the modulation rate, is needed.

SUMMARY OF THE INVENTION

To solve the above problem, it is an objective of the present invention to provide a phase locked loop (PLL) for reducing electromagnetic interference (EMI), where the PLL is not sensitive to a manufacturing process, consumes less power, occupies a small layout space, and can flexibly control the modulation frequency and the modulation rate.

The invention is directed to a PLL for reducing EMI. The PLL of the invention includes a pre-divider for generating a reference frequency signal by dividing the signal inputted to the PLL by a pre-defined value, a phase detector for receiving the reference frequency signal and a feedback signal, detecting the phase difference between the two signals, generating a control signal depending on the detected phase difference and outputting a control voltage generated as a result of processing of the control signal by a pre-defined process, a voltage controlled oscillator (VCO) for receiving the control voltage and multiple switching control signals, and outputting a first oscillation signal having a pre-defined frequency in response to the control voltage while outputting a second oscillation signal which is delayed by as much as n-times (where n is an integer) the basic delay time of the first oscillation signal, in response to the multiple switching control signals, a main divider for receiving the second oscillation signal and outputting the feedback signal that commands the increase or decrease of the frequency of the first oscillation signal, a modulation control block for receiving modulation frequency data, modulation rate data, the feedback signal, and the second oscillation signal, and outputting the multiple switching control signals, and a post-divider for receiving the first oscillation signal and outputting signals by dividing the first oscillation signal by a pre-defined value.

A PLL for reducing EMI according to a second embodiment of the present invention includes a phase detection and filter unit, a voltage-controlled oscillator (VCO), a phase interpolator, a modulation control block, and a main divider. The phase detection and filter unit compares the phase of a predetermined reference frequency signal with the phase of a predetermined feedback signal to generate a control voltage having a value variable according to the difference of phases. The VCO generates a first oscillation signal having a frequency variable in response to the control voltage and first through $M^{th}$ clock signals having frequencies variable in response to the control voltage. The phase interpolator receives the first through $M^{th}$ clock signals, divides the phase difference between two sequential clock signals of the first through $M^{th}$ clock signals in response to predetermined first through $N^{th}$ switching control signals, and generates a second oscillation signal having a frequency as much as n-times (where n is an integer) a predetermined basic delay time. The modulation control block receives modulation frequency data, modulation rate data, modulation step data, the feedback signal, and the second oscillation signal to output the first through $N^{th}$ switching control signals. The main divider receives the second oscillation signal to output the feedback signal that indicates the increase or decrease of the frequency of the first oscillation signal.

In one embodiment, the basic delay time is formed by dividing one period of the first oscillation signal by $2^N-1$, wherein N is the number of the switching control signals.

The PLL can further include a pre-divider and a post divider. The pre-divider outputs the reference frequency signal formed by dividing an input signal by a predetermined value. The post-divider outputs a signal formed by dividing the first oscillation signal by a predetermined value.

The modulation control block can include a modulation frequency control block and a modulation rate control block. The modulation frequency control block outputs a selection signal that selects the increase or decrease of a modulation rate in response to the feedback signal and the modulation frequency signal. The modulation rate control block outputs the first through $N^{th}$ switching control signals in response to the feedback signal, the modulation rate data, the second oscillation signal, the modulation step data, and the selection signal.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 14 shows the waveforms illustrating first and second oscillation signals, a reference frequency signal, and a feedback signal of FIG. 11.

FIG. 15 shows the generation a modulation frequency data, a modulation rate data, and a modulation step data.

DETAILED DESCRIPTION OF THE INVENTION

According to the present invention, a phase locked loop (PLL) for reducing electromagnetic Interference (EMI) divides the output signal of a voltage-controlled oscillator (VCO) by multiple signals having a phase difference, combines the signals having the phase difference to reduce EMI, and outputs a modulated output signal.

Figure 1:
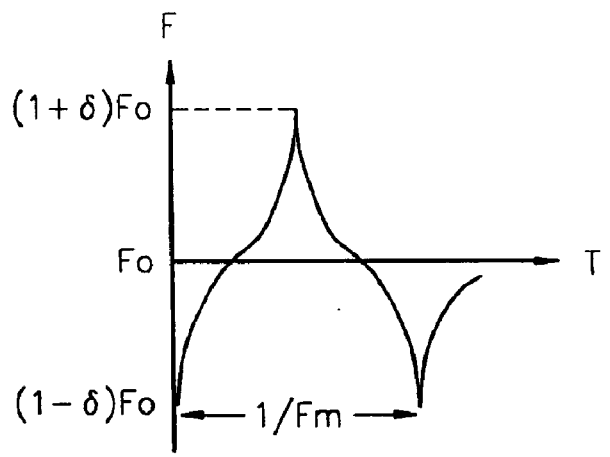
FIG. 1 is a graph showing modulation frequency and modulation rate.
Figure 2:
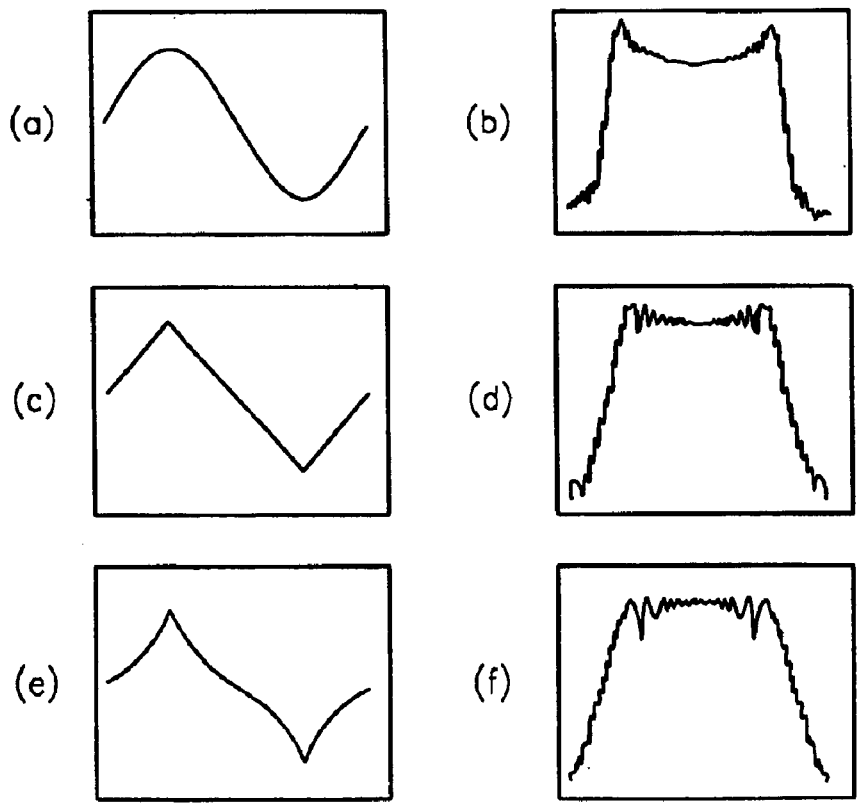
FIG. 2 shows the profiles and spectrums of modulated signals.
Figure 3:
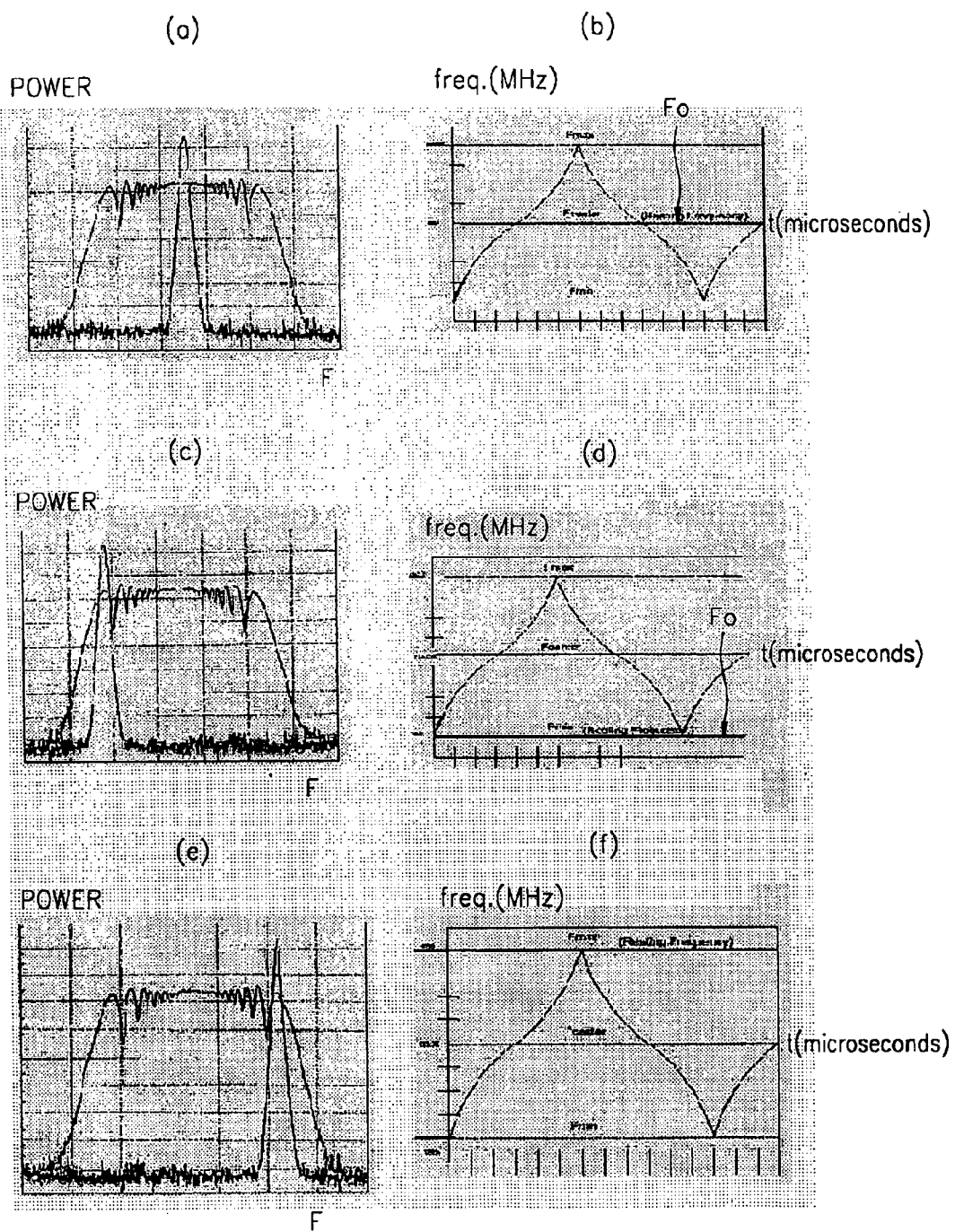
FIG. 3 shows the spectrums of a dithered phase locked loop (PLL) power corresponding to different spreading methods.
Figure 4:
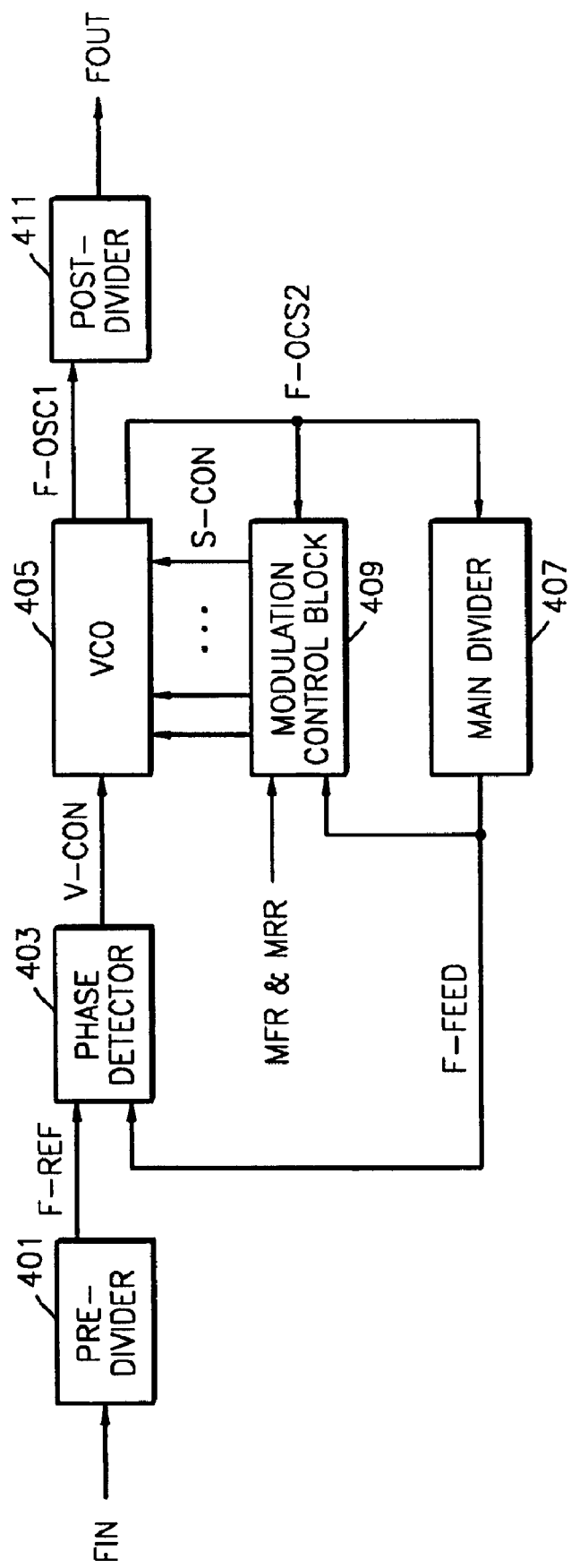
FIG. 4 is a block diagram of a PLL for reducing electromagnetic interference (EMI) according to one embodiment of the present invention.

FIG. 4 is a block diagram of one embodiment of the PLL for reducing EMI according to the present invention.

As shown in FIG. 4, the PLL for reducing the EMI includes a pre-divider 401 for generating a reference frequency signal F-REF by dividing a signal FIN inputted to the PLL by a pre-defined value, a phase detector 403 for receiving the reference frequency signal F-REF and a feedback signal F-FEED, detecting the phase difference between the two signals, generating a control signal depending on the detected phase difference, and outputting a control voltage V-CON generated as a result of charge pumping and loop filtering the control signal, a voltage controlled oscillator VCO 405 for receiving the control voltage V-CON and multiple switching control signals S-CON, outputting a first oscillation signal F-OSC1 having a pre-defined frequency in response to the control voltage V-CON while outputting a second oscillation signal F-OSC2, which is delayed by as much as n-times (where n is an integer) the basic delay time of the first oscillation signal F-OSC1, in response to the multiple switching control signals S-CON, a main divider 407 for receiving the second oscillation signal F-OSC2 and outputting the feedback signal F-FEED that commands the increase or decrease of the frequency of the first oscillation signal F-OSC1, a modulation control block 409 for receiving modulation frequency data MFR, modulation rate data MRR that can be stored in the register (not shown) or provided by the outside of the PLL, the feedback signal F-FEED, and the second oscillation signal F-OSC2, and outputting the multiple switching control signals S-CON, and a post-divider 411 for receiving the first oscillation signal F-OSC1 and outputting signals FOUT by dividing the first oscillation signal by a pre-defined value.

Figure 5:
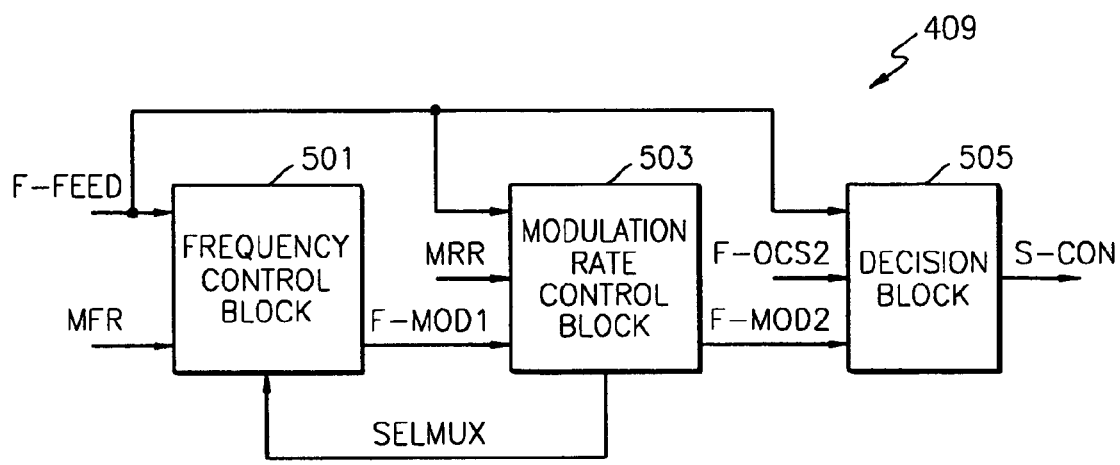
FIG. 5 is an internal block diagram of a modulation control block shown in FIG. 4.

FIG. 5 is an internal block diagram of the modulation control block 409 shown in FIG. 4.

With reference to FIG. 5, the modulation control block 409 includes a modulation frequency control block 501 for outputting the first modulation signal F-MOD1 in response to the feedback signal F-FEED, modulation frequency data MFR, and a selection signal SELMUX, a modulation rate control block 503 for outputting the selection signal SELMUX and the second modulation signal F-MOD2, in response to the feedback signal F-FEED, the modulation rate data MRR and the first modulation signal F-MOD1, and a decision block 505 for outputting multiple switching control signals S-CON in response to the feedback signal F-FEED, the second oscillation signal F-OSC2, and the second modulation signal F-MOD2.

Figure 6:
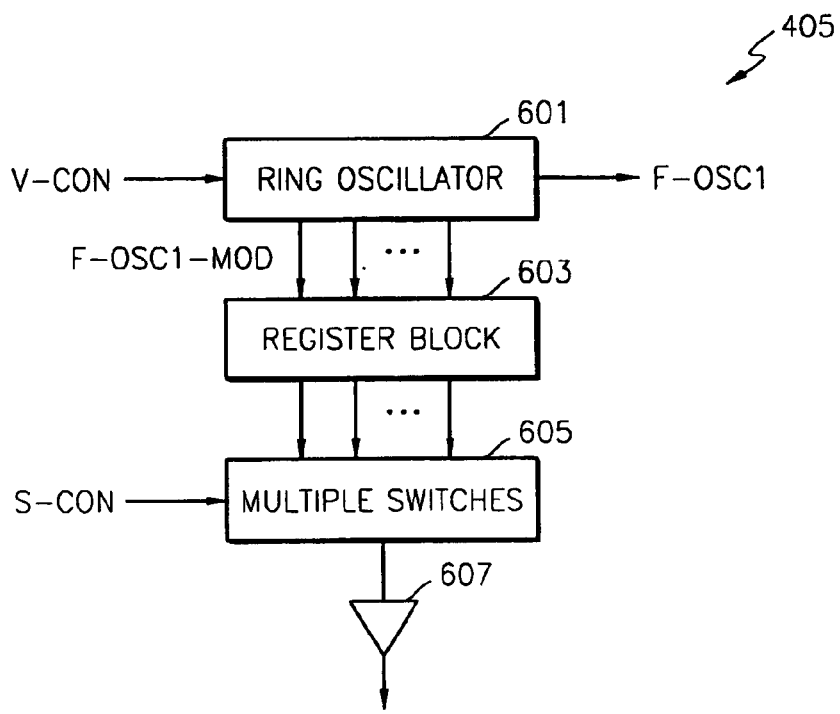
FIG. 6 is an internal block diagram of a voltage controlled oscillator (VCO) shown in FIG. 4.

FIG. 6 is an internal block diagram of the VCO shown in FIG. 4.

As shown in FIG. 6, the VCO 405 includes a ring oscillator 601 for outputting the first oscillation signal F-OSC1 having a pre-defined frequency in response to the control voltage V-CON and for outputting multiple modulation oscillation signals F-OSC1-MOD which lead or are delayed by as much as the time calculated after one cycle of the first oscillation signal F-OSC1 is divided by the number of multiple switching control signals S-CON, a register block 603 for including multiple registers that store multiple modulation oscillation signals F-OSC1-MOD, multiple switches 605 for selecting and switching one of the multiple modulation oscillation signals F-OSC1-MOD stored in the register block 603, in response to the multiple switching control signals S-CON, and an output buffer 607 for buffering and outputting FOUT the signal inputted through one switch selected among the multiple switches 605.

The present invention will be described below using the example of the up spreading method.

Figure 7:
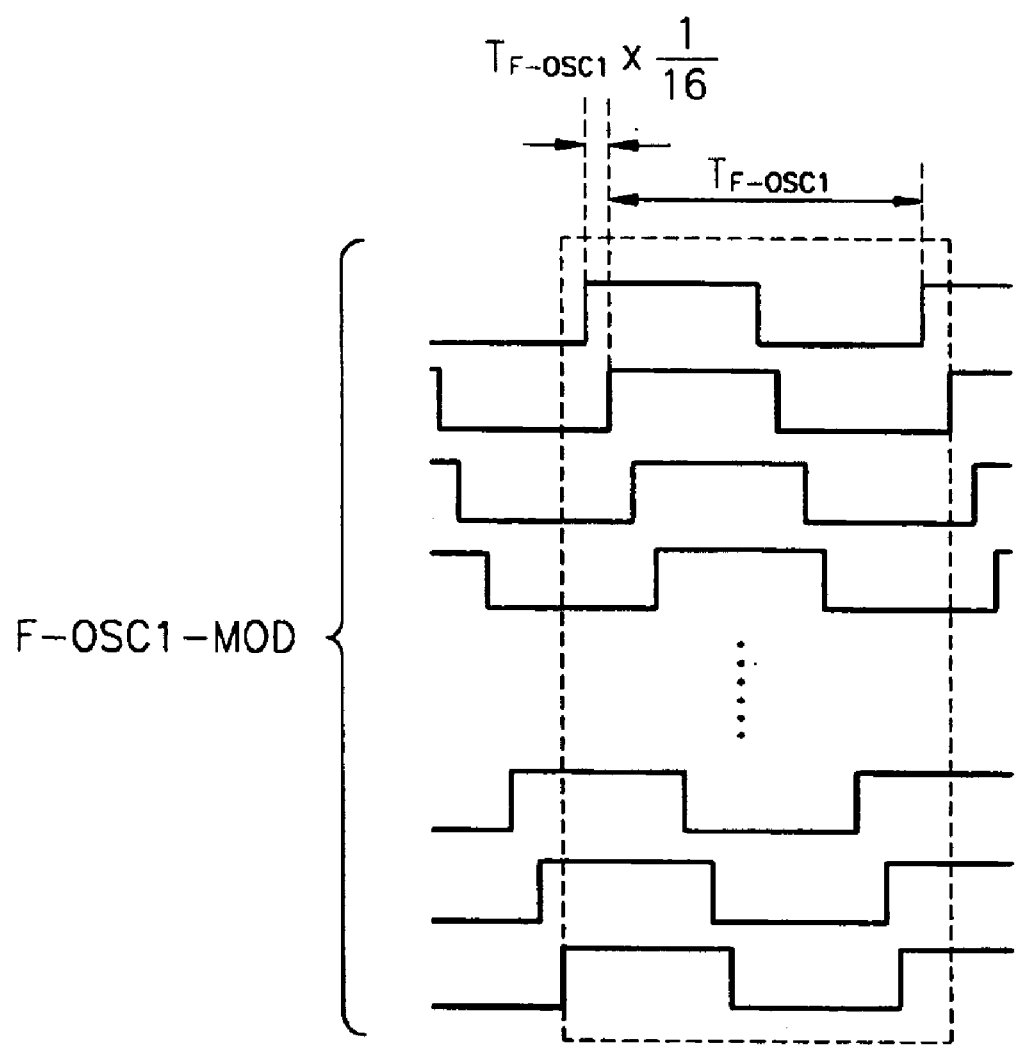
FIG. 7 is a timing diagram of multiple modulation oscillation signals F-OSC1-MOD stored in a register block shown in FIG. 6.

FIG. 7 is a timing diagram of the multiple modulation oscillation signals F-OSC1-MOD stored in the register block 603 shown in FIG. 6.

According to FIG. 7, the multiple modulation oscillation signals F-OSC1-MOD are delayed by as much as the basic delay time. Here, the basic delay time can be calculated by dividing one cycle $T_{F-OSC1}$ of the first oscillation signal F-OSC1 by the number of the multiple switching control signals S-CON. For example, if the number of switching control signals S-CON is 16, the basic delay time is $T_{F-OSC1} \times 1/16$.

Figure 8:
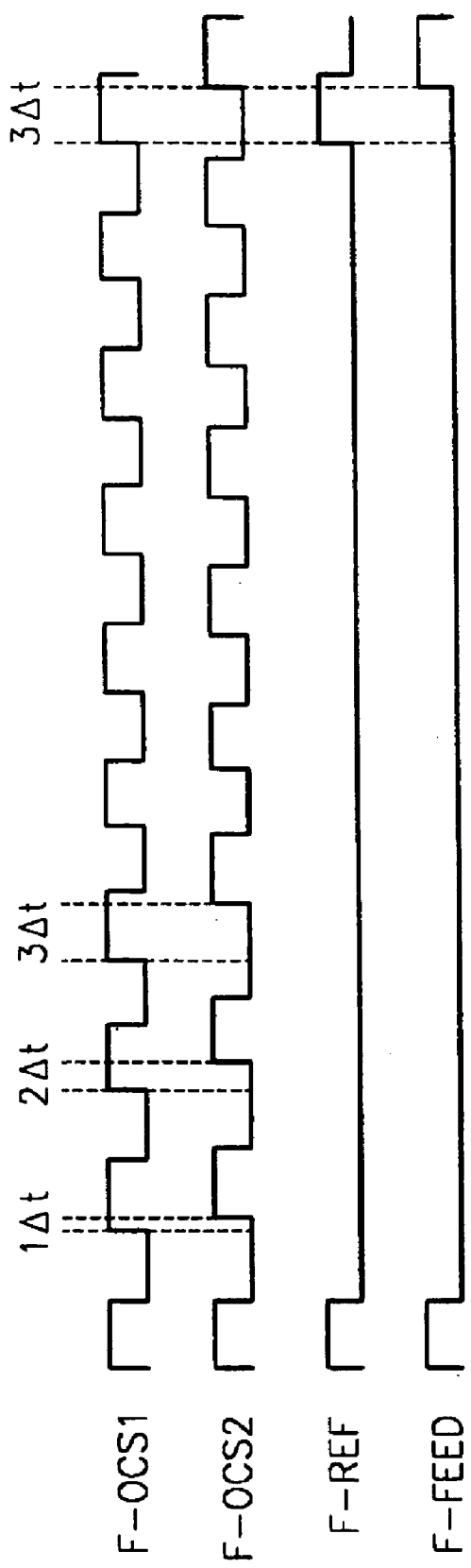
FIG. 8 contains timing diagrams of a first oscillation signal F-SOC1, a reference frequency signal F-REF, and a feedback signal F-FEED which is delayed by a pre-defined period of time.

FIG. 8 shows timing diagrams of the first oscillation signal F-OSC1, the reference frequency signal F-REF, and the feedback signal F-FEED which is delayed by a pre-defined period of time.

With reference to FIGS. 4 and 8, the generation of signals and relationships between the signals will be described. The phase detector 403 outputs the control voltage V-CON corresponding to the phase difference between the reference signal F-REF outputted by the pre-divider 401 and the feedback signal F-FEED. The VCO 405 generates the first oscillation signal F-OSC1 in response to the control voltage V-CON. In addition, the VCO 405 selects the second oscillation signal F-OSC2 among the signals generated when the first oscillation signal F-OSC1 is delayed by n-times the basic delay time ($\Delta t$), in response to the multiple switching control signals S-CON. By way of example, it is assumed that the second oscillation signal is delayed by 3 times ($3\Delta t$) the basic delay time ($\Delta t$). The main divider 407 generates a feedback signal F-FEED using the second oscillation signal F-OSC2.

FIG. 8 indicates that the feedback signal F-FEED is delayed by 3 times ($3\Delta t$) the basic delay time ($\Delta t$) when compared to the reference frequency signal F-REF. The delay time is equivalent to the command to order the phase detector 403 to increase the frequency of the first oscillation signal F-OSC1.

Figure 9:
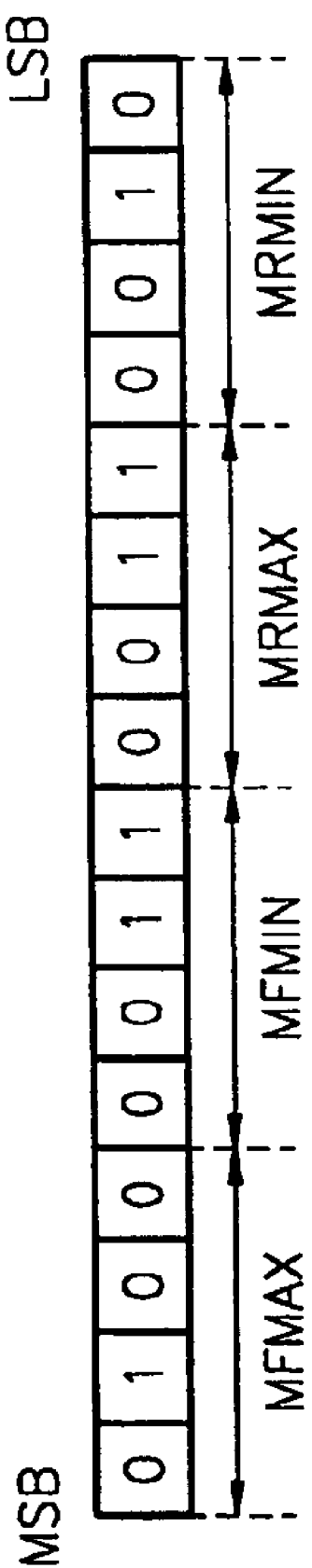
FIG. 9 shows data bits corresponding to the modulation frequency and the modulation rate.

FIG. 9 shows data bits corresponding to the modulation frequency and the modulation rate.

FIG. 9 shows the maximum modulation frequency MFMAX and the minimum modulation frequency MFMIN and the maximum modulation rate MRMAX and the minimum modulation rate MRMIN. Here, by way of example, the maximum modulation frequency MFMAX is 4, the minimum modulation frequency MFMIN is 3, the maximum modulation rate MRMAX is 3, and the minimum modulation rate MRMIN is 2.

Figure 10:
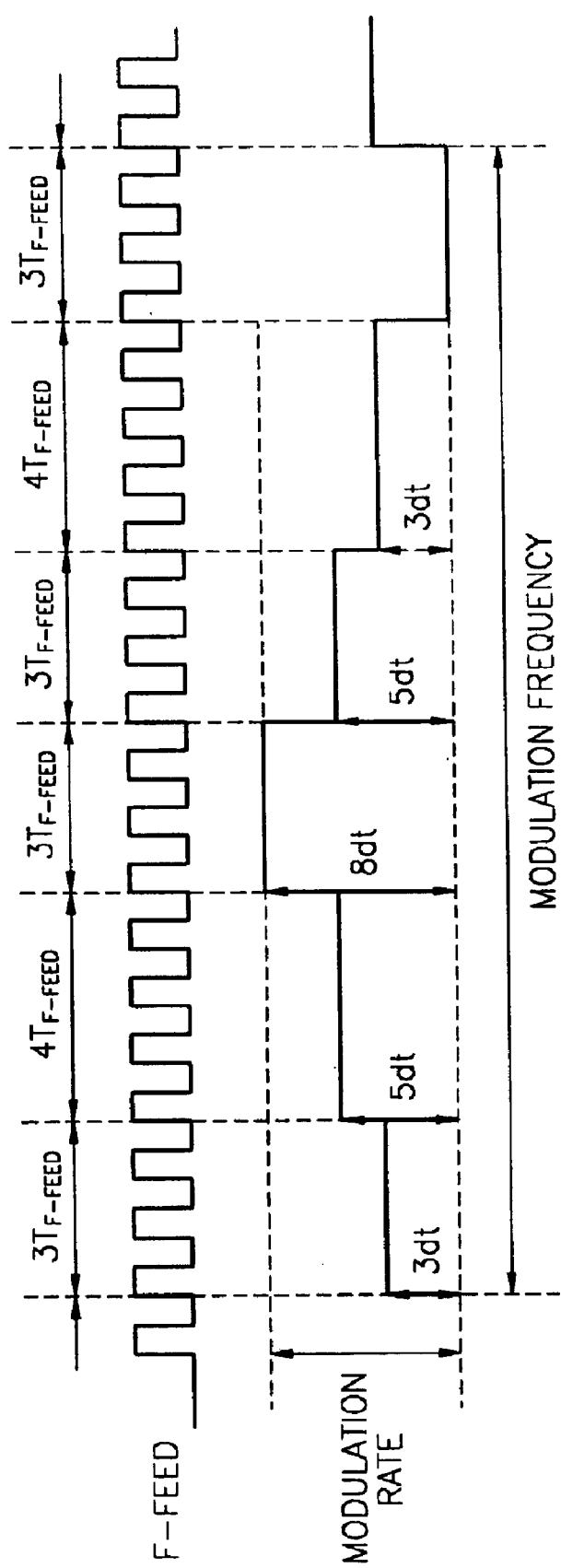
FIG. 10 is a timing diagram of a signal modulated by the PLL for reducing EMI according to the present invention.

FIG. 10 shows a timing diagram of the signal modulated by the PLL for reducing EMI according to the present invention.

Referring to FIG. 10, the present invention selects three feedback signals $3T_{F-FEED}$ with the modulation rate of 3, then four feedback signals $4T_{F-FEED}$ with the modulation rate of 5, three feedback signals $3T_{F-FEED}$ with the modulation rate of 8, three feedback signals $3T_{F-FEED}$ with the modulation rate of 5, four feedback signals $4T_{F-FEED}$ with the modulation rate of 3, and three feedback signals $3T_{F-FEED}$ with the modulation rate of 0 during one cycle. That is, during one cycle of the modulation frequency, 20 feedback signals are included.

The modulation rates will be described below.

First, three feedback signals having the modulation rate of 3 (3dt) are selected. The modulation rate (5dt) of four feedback signals selected second is higher than that of the first three feedback signals by 2 dt. The modulation rate (8dt) of three feedback signals selected third is higher than that of the four feedback signals selected second by 3 dt. The modulation rate (5dt) of three feedback signals selected fourth is lower than that of the three feedback signals selected third by 3 dt. The modulation rate (3dt) of four feedback signals selected fifth is lower than that of the feedback signals selected fourth by 2 dt. The modulation rate (0dt) of three feedback signals selected sixth is lower than that of the four feedback signals selected fifth by 3 dt.

As for one cycle of the above described modulation frequency, sawtooth (or triangular) frequency signal profiles are expected.

The ratio of the minimum frequency signal to the maximum frequency signal is the modulation rate. The cycle where the minimum frequency signal is increased to the maximum frequency signal and is reduced again is the index indicating the modulation frequency. As shown in FIG. 9, if the modulation frequency and the modulation rate are given, the number of the switching control signals S-CON is 16, and the reference frequency signal F-REF is 4 MHz, then the modulation rate is 2 MHz (4 MHz×8/16) and the modulation frequency is 200 KHz (4 MHz/20).

The minimum value and the maximum values prevent the response characteristics of the PLL from distorting the modulation signal profiles.

Figure 11:
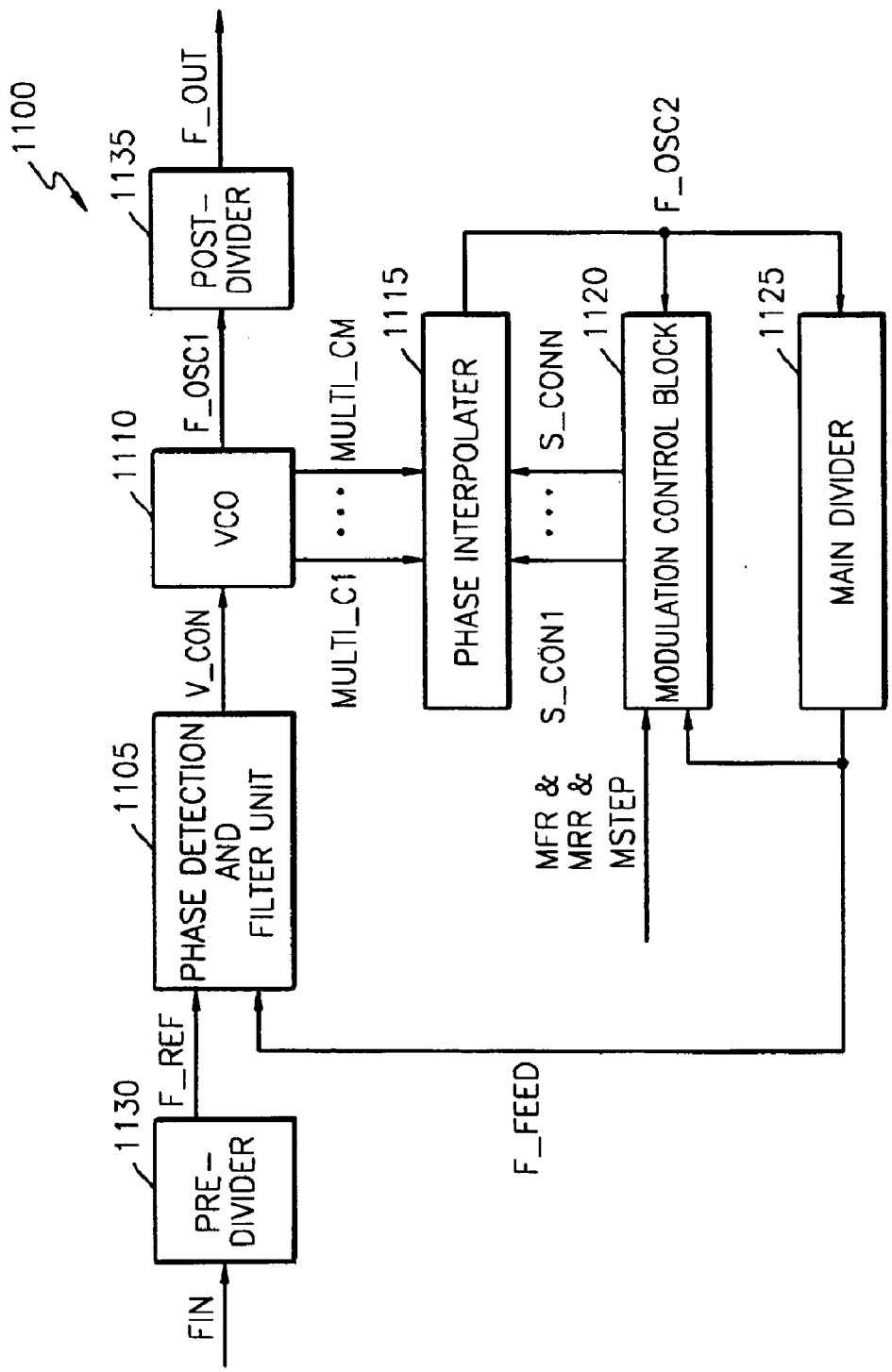
FIG. 11 is a block diagram of a PLL for reducing EMI according to a second embodiment of the present invention.
Figure 12:
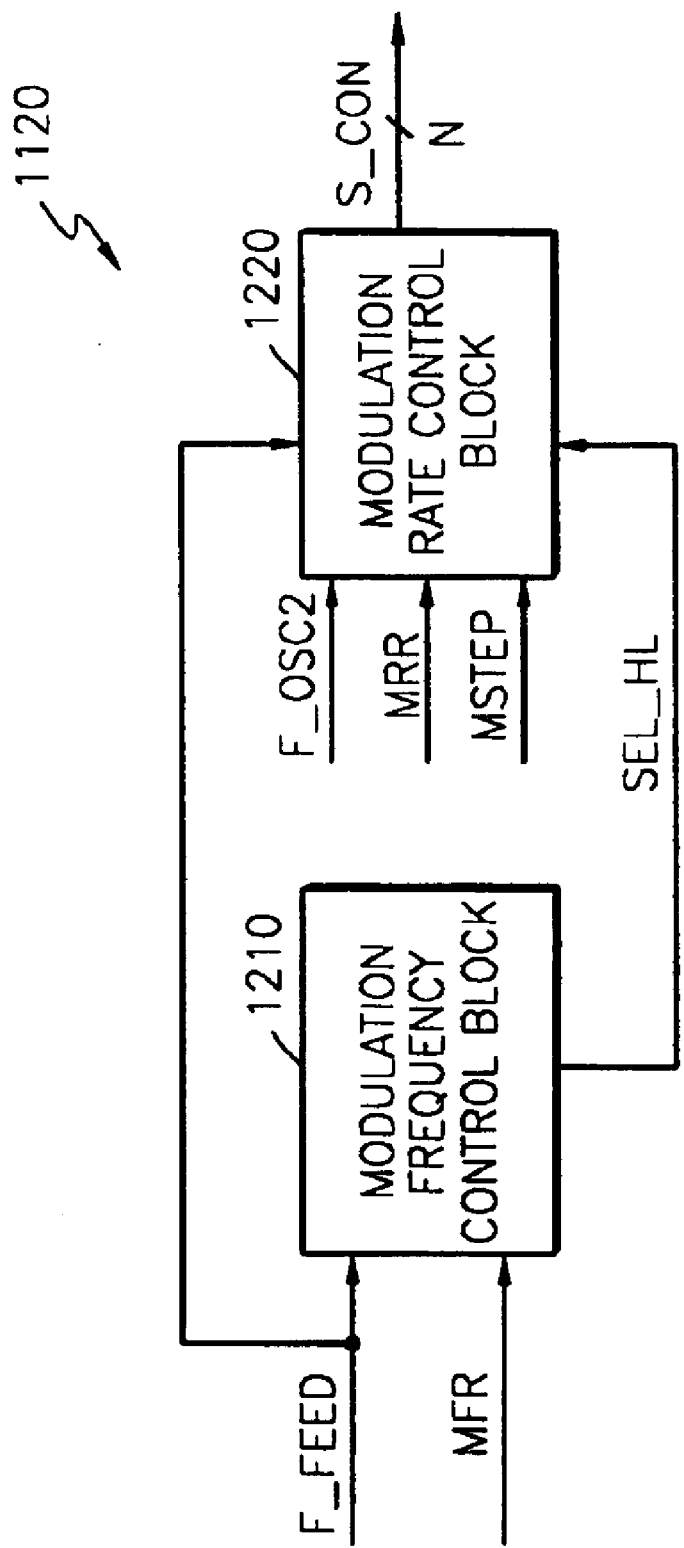
FIG. 12 is a block diagram of a modulation control block of FIG. 11.

FIG. 11 contains a block diagram of a PLL for reducing EMI according to a second embodiment of the present invention. FIG. 12 contains a block diagram of a modulation to control block of FIG. 11.

Referring to FIGS. 11 and 12, a PLL 1100 for reducing EMI according to the second embodiment of the present invention includes a phase detection and filter unit 1105, a VCO 1110, a phase interpolator 1115, a modulation control block 1120, and a main divider 1125.

The phase detection and filter unit 1105 compares the phase of a predetermined reference frequency signal F_REF with the phase of a predetermined feedback signal F_FEED to generate a control voltage V_CON having a value that is variable in response to the difference between phases.

The VCO 1110 generates a first oscillation signal F_OSC1 having a frequency that is variable in response to the control voltage V_CON and first through $M^{th}$ clock signals MULTI_C1~MULTI_CM having frequencies that are variable in response to the control voltage V_CON.

The phase interpolator 1115 receives the first through $M^{th}$ clock signals MULTI_C1~MULTI_CM and divides the phase difference between two sequential clock signals from the first through $M^{th}$ clock signals MULTI_C1~MULTI_CM in response to predetermined first through $N^{th}$ switching control signals S_CON1~S_CONN. In addition, the phase interpolator 1115 generates a second oscillation signal F_OSC2 having a frequency as much as n-times (where n is an integer) of a predetermined basic delay time.

More specifically, the basic delay time is determined by dividing one period of the first oscillation signal F_OSC1 by $2^N-1$. Here, N is the number of the switching control signals.

The modulation control block 1120 receives modulation frequency data MFR, modulation rate data MRR, modulation step data MSTEP, a feedback signal F_FEED, and a second oscillation signal F_OSC2 to output the first through $N^{th}$ switching control signals S_CON1~S_CONN.

More specifically, the modulation control block 1120 includes a modulation frequency control block 1210 and a modulation rate control block 1220.

The modulation frequency control block 1210 outputs a selection signal SEL_HL for selecting whether a modulation rate increases or decreases in response to the feedback signal F_FEED and the modulation frequency data MFR. The modulation rate control block 1220 outputs the first through $N^{th}$ switching control signals S_CON1~SCONN in response to the modulation rate data MRR, the second oscillation signal F_OSC2, the modulation step data MSTEP, and the selection signal SEL_HL.

The main divider 1125 receives the second oscillation signal F_OSC2 to output the feedback signal F_FEED for indicating the increasing or the decreasing, i.e., change, of the frequency of the first oscillation signal F_OSC1.

The PLL 1100 further includes a pre-divider 1130 and a post-divider 1135. The pre-divider 1130 outputs a reference frequency signal F_REF by dividing an input signal FIN by a predetermined value. The post-divider 1135 outputs a signal F_OUT by dividing the first oscillation signal F_OSC1 by a predetermined value.

The operation of a PLL for reducing EMI according to the second embodiment of the present invention will be described with reference to FIGS. 11 and 12.

The PLL 1100 for reducing EMI according to the second embodiment of the present invention uses a reference frequency signal F_REF having a relatively high frequency by using the function of the phase interpolator 1115. Accordingly, the jitter of the PLL can be reduced.

That is, the phase interpolator 1115 divides the phase difference between two sequential clock signals from the first through $M^{th}$ clock signals MULTI_C1~MULTI_CM output from the VCO 1110. Therefore, since the number of modulation steps increases when the modulation rates are the same, it is possible to establish a wide bandwidth for the PLL to obtain a desired frequency characteristic.

For example, it is assumed that a modulation rate is established as 0.5%. Accordingly, when an output frequency is 100 Mhz, a modulation rate becomes 0.5 Mhz. If the VCO 1110 generates only 16 clock signals, the following relationship can be established to generate a modulation rate of 0.5 Mhz.

1 Mhz (reference frequency signal F_REF)*$8/16$=0.5 Mhz

2 Mhz (reference frequency signal F_REF)*$4/16$=0.5 Mhz

4 Mhz (reference frequency signal F_REF)*$2/16$=0.5 Mhz

8 Mhz (reference frequency signal F_REF)*$1/16$=0.5 Mhz

Here, it is preferable that the reference frequency signal F_REF level increase in order to reduce the jitter of the PLL. However, as the reference frequency signal F_REF increases, the number of modulation steps decreases from 8 to 4 to 2 to 1 so that the modulation can fail.

Here, if the gaps between clock signals of the VCO 1110 are divided into 10 phases using the phase interpolator 1115, 160 phases can be used for the modulation. Accordingly, the following relationship can be established.

4 Mhz (reference frequency signal F_REF)*$20/160$=0.5 Mhz

8 Mhz (reference frequency signal F_REF)*$10/160$=0.5 Mhz

16 Mhz (reference frequency signal F_REF)*$5/160$=0.5 Mhz

Accordingly, the number of modulation steps increases by using the phase interpolator 1115 while using the reference frequency signals F_REF having relatively high frequencies. That is, in realizing PLLs having the same modulation rate, a reference frequency signal F_REF having a higher frequency can be input into the PLL when a larger number of modulation steps are provided.

The operation of the PLL 1100 of FIG. 11 is the same as the operation of the PLL of FIG. 4 except for the phase interpolator 1115. Accordingly, the operation of the PLL 1100 of FIG. 11 will now be described by focusing on the difference from the operation of the PLL of FIG. 4.

The phase detection and filter unit 1105 compares the phase of the reference frequency signal F_REF with the phase of a predetermined feedback signal F_FEED to generate a control voltage V_CON having a value variable according to the difference between phases.

The phase detection and filter unit 1105 operates as a phase detector and a low pass filter, which are arranged in a PLL. That is, a difference between the phase of the reference frequency signal F_REF and the phase of a feedback signal F_FEED is used to generate the control voltage V_CON having a voltage level varied according to the phase difference.

The VCO 1110 outputs a first oscillation signal F_OSC1 and first through $M^{th}$ clock signal MULTI_C1~MULTI_CM having frequencies variable according to the control voltage V_CON.

The VCO 1110 includes a ring oscillator (not shown) that generates a plurality of outputs having difference phases. One of the outputs is a first oscillation signal F_OSC1 having a frequency variable according to the increase and decrease of the voltage level of the control voltage V_CON. The other outputs are generated as the first through $M^{th}$ clock signals MULTI_C1~MULTI_CM. Here, the periods of the first oscillation signal F_OSC1 and the first through $M^{th}$ clock signals MULTI_C1~MULTI_CM are the same.

Since the operation of the ring oscillator can be understood by those skilled in the art, description of the operation of the VCO 1110 is omitted.

The phase interpolator 1115 receives the first through $M^{th}$ clock signals MULTI_C1~MULTI_CM and divides the phase difference between two sequential clock signals from the first through $M^{th}$ clock signals MULTI_C1~MULTI_CM in response to predetermined first through $N^{th}$ switching control signals S_CON1~S_CONN. In addition, the phase interpolator 1115 generates a second oscillation signal F_OSC2 having a frequency as much as n-times (where n is an integer) a predetermined basic delay time. The basic delay time is determined by dividing one period of the first oscillation signal F_OSC1 by $2^N-1$. Here, N is the number of switching control signals. The operation of the phase interpolator 1115 will be described below.

The modulation control block 1120 receives modulation frequency data MFR, modulation rate data MRR, modulation step data MSTEP, a feedback signal F_FEED, and a second oscillation signal F_OSC2 to output the first through $N^{th}$ switching control signals S_CON1~S_CONN. The modulation frequency data MFR, the modulation rate data MRR, and the modulation steps MSTEP can be input from the outside or can be stored in a register (not shown).

More specifically, the modulation control block 1120 includes a modulation frequency control block 1210 and a modulation rate control block 1220. The modulation frequency control block 1210 outputs a selection signal SEL_HL for selecting whether a modulation rate increases or decreases in response to the feedback signal F_FEED and the modulation frequency data MFR.

The modulation rate control block 1220 outputs the first through $N^{th}$ switching control signal S_CON1~SCONN in response to the feedback signal F_FEED, the modulation rate data MRR, the second oscillation signal F_OSC2, the modulation step data MSTEP, and the selection signal SEL_HL. The operation of the modulation control block 1120 will be described below.

The main divider 1125 receives the second oscillation signal F_OSC2 to output the feedback signal F_FEED for indicating the increase or the decrease of the frequency of the first oscillation signal F_OSC1. The operation of the main divider 1125 is the same as that of the main divider 407 of FIG. 4. Accordingly, the description of the operation of the main divider 1125 will be omitted.

The PLL 1100 further includes a pre-divider 1130 and a post-divider 1135.

Here, the pre-divider 1130 outputs a reference frequency signal F_REF by dividing an input signal FIN by a predetermined value. The post-divider 1135 outputs a signal by dividing the first oscillation signal F_OSC1 by a predetermined value. The operations of the pre-divider 1130 and the post-divider 1135 are the same as those of the pre-divider 401 and the post-divider 411 of FIG. 4 so that the descriptions of the operation of the pre-divider 1130 and the post-divider 1135 will be omitted.

Figure 13:
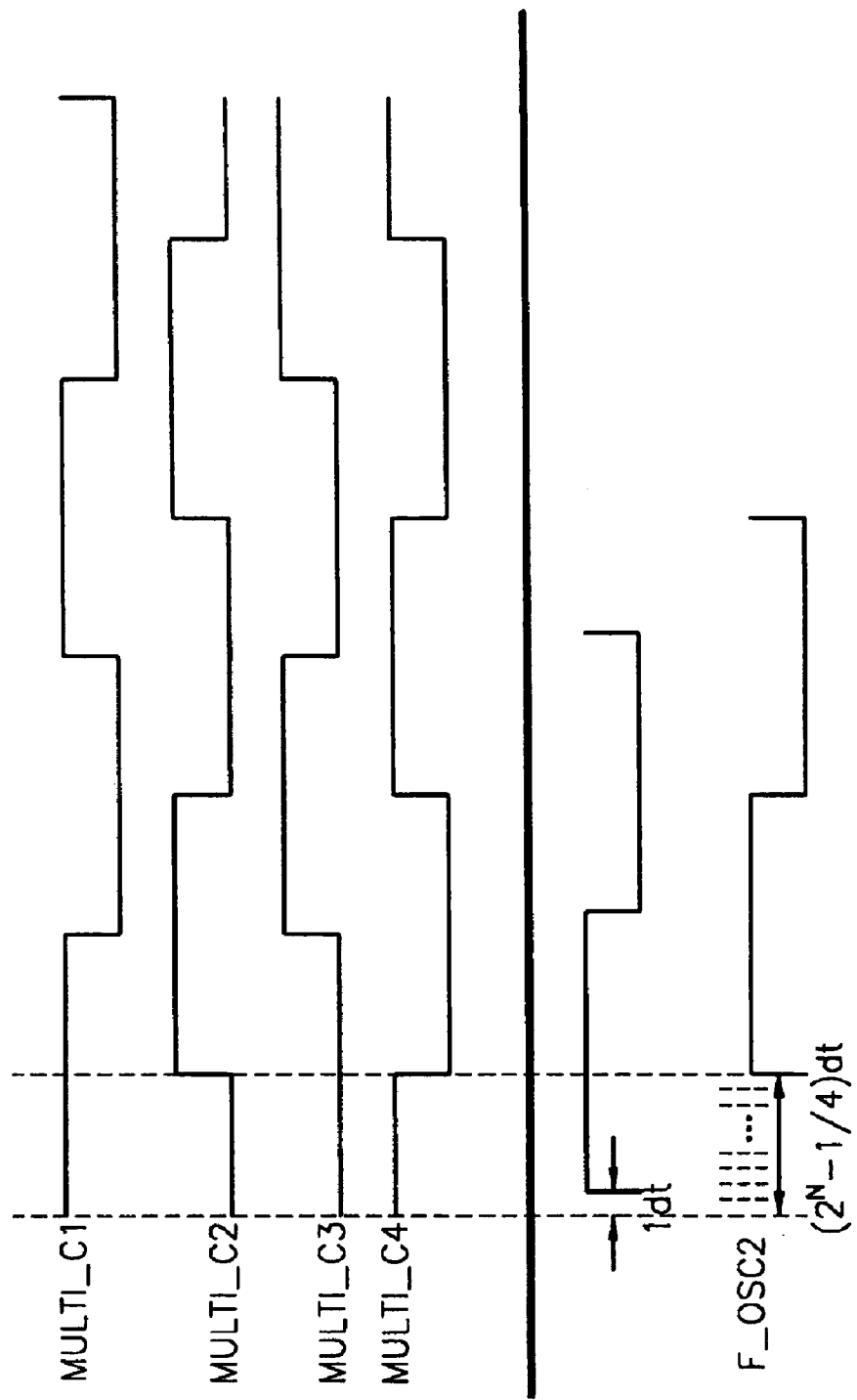
FIG. 13 shows the waveforms of first through $M^{th}$ clock signals and a second oscillation signal of FIG. 11.

FIG. 13 shows the waveforms of first through $M^{th}$ clock signals and a second oscillation signal of FIG. 11. Here, by way of example, M is assumed to be four. That is, it is assumed that four clock signals MULTI_C1, MULTI_C2, MULTI_C3, and MULTI_C4 are output from the VCO 1110. Here, the clock signals MULTI_C1, MULTI_C2, MULTI_C3, and MULTI_C4 have the same period.

The phase interpolator 1115 divides a phase difference between two sequential clock signals, for example, the first and second clock signals MULTI_C1 and MULTI_C2, in response to the first through $N^{th}$ switching control signals S_CON1~S_CONN to generate a plurality of signals. Here, one from the plurality of signals is generated as the second oscillation signal F_OSC2.

The number of the plurality of signals that are generated by dividing the phase difference between the first and second clock signals MULTI_C1 and MULTI_C2 is determined by the number of the switching control signals S_CON. If the number of the switching control signals S_CON is N, the number of the plurality of signals can be $2^N-1$ at most.

Accordingly, the basic delay time 1dt is calculated by using equation 1.

$$T\_CLOCK/(2^N-1) \quad (1)$$

Here, T_CLOCK is the period of the clock signal output from the VCO 1110.

FIG. 14 shows the waveforms illustrating first and second oscillation signals, a reference frequency signal, and a feedback signal of FIG. 11.

The phase detection and filter unit 1105 generates the control voltage V_CON corresponding to the difference between the phase of the reference frequency signal F_REF and the phase of the feedback signal F_FEED. The VCO 1110 generates the first oscillation signal F_OSC1 in response to the increase and decrease of the voltage level of the control voltage V_CON. When the control voltage V_CON increases or decreases, the frequency of the first oscillation signal F_OSC1 increases or decreases.

The second oscillation signal F_OSC2 is generated in the phase interpolator 1115 in response to the first through $M^{th}$ clock signals MULTI_C1~MULTI_CM generated in the VCO 1110 and the first through $N^{th}$ switching control signals S_CON1~S_CONN generated in the modulation control block 1120. The second oscillation signal F_OSC2 may be delayed by n-times (where n is an integer) of the basic delay time 1dt.

The main divider 1125 generates the feedback signal F_FEED in response to the second oscillation signal F_OSC2. The main divider 1125 increases or decreases the speed of the feedback signal F_FEED according to the delay time of the second oscillation signal F_OSC2. Consequently, the feedback signal F_FEED is compared with the reference frequency signal F_REF so that the frequency of the first oscillation signal F_OSC1 is increased or decreased.

Referring to FIG. 14, in a period (i) for comparing the reference frequency signal F_REF with the feedback signal F_FEED, the second oscillation signal F_OSC2 is delayed for the basic delay time 1dt (ii) and delayed for the basic delay time 1dt (iii) again. As a result, the second oscillation signal F_OSC2 is delayed by twice of the basic delay time 1dt compared to the first oscillation signal F_OSC1.

Accordingly, the feedback signal F_FEED that responds to the second oscillation signal F_OSC2 is delayed from the reference frequency signal F_REF by twice of the basic delay time 1dt. Here, the delay of the feedback signal F_FEED controls the control voltage V_CON to increase the frequency of the first oscillation signal F_OSC1.

FIG. 15 shows the establishment or generation of modulation frequency data, modulation rate data, and a modulation step data.

Figure 16:
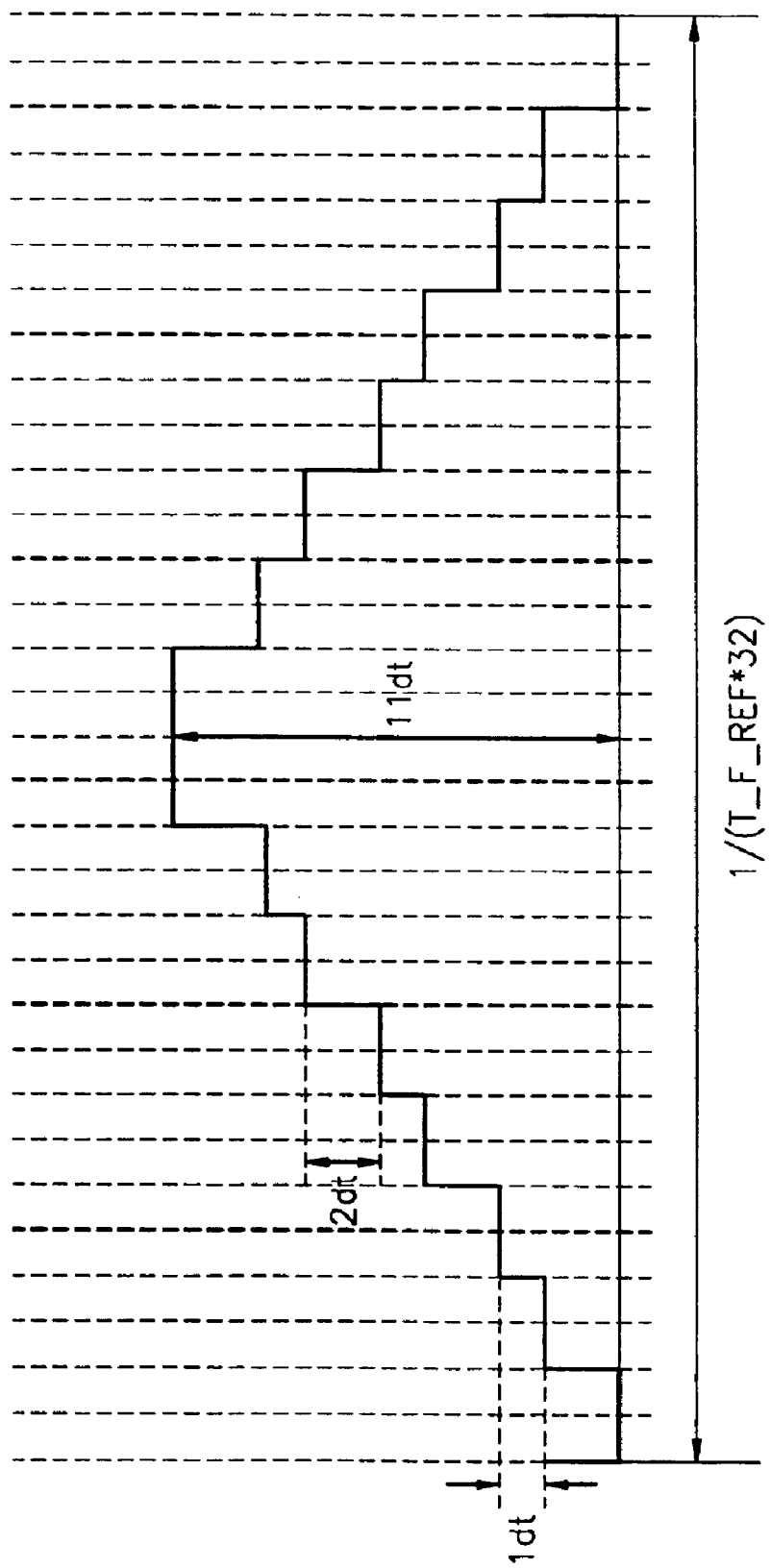
FIG. 16 shows the modulation amount of a second oscillation signal.

FIG. 16 shows the modulation amount of a second oscillation signal.

The modulation frequency data MFR, the modulation rate data MRR, and the modulation step data MSTEP are stored in a register (not shown). Here, the modulation frequency can be attained from the modulation frequency data MFR. Since the modulation frequency data MFR is 32, the modulation frequency is 1/(T_F_REF*32). Here, T_F_REF is the period of the reference frequency signal F_REF.

Both the maximum value MSTEPMAX and the minimum value MSTEPMIN of the modulation step data MSTEP denote 2, which means that a modulation rate is changed whenever the clocks of the reference frequency signals F_REF are generated two times. If the maximum value MSTEPMAX of the modulation step data MSTEP is 3 and the minimum value MSTEPMIN is 2, the modulation rate is changed when the clocks of the reference frequency signal F_REF is generated three times and then the modulation rate is changed again when the clocks of the reference frequency signal F_REF is generated two times.

The maximum value MRMAX of the modulation rate data MRR is 2 and the minimum value MRMIN is 1. Accordingly, the modulation rate is changed by 2dt, 1dt, and 2dt, repeatedly.

Referring to FIG. 16, the modulation rate is modulated by 2dt when the clocks of the reference frequency signal F_REF are generated two times for the first time and modulated by 2dt+1dt when the clocks of the reference frequency signal F_REF are generated two times for the second time. The modulation rate is modulated by 2dt+1dt+2dt when the clocks of the reference frequency signal F_REF are generated two times for the third time and modulated by 2dt+1dt2dt+1dt when the clocks of the reference frequency signal F_REF are generated two times for the fourth time.

Here, the maximum modulation rate is 11dt as shown in FIG. 16. If the phase interpolator 1115 can generate a signal having a phase difference formed by multiplying the basic delay time of $2^N-1$, which is due to N switching control signals S_CON, by an integer, the amount of the modulated frequencies in FIG. 16 can be calculated by using equation 2.

$$\text{reference frequency signal } F\_REF*11/(2^N-1) \quad (2)$$

Referring to equation 2, in order to reduce the amount of the modulation frequencies, the frequency of the reference frequency signal F_REF has to be lowered or the value of $2^N-1$ has to be increased. However, as the frequency of the reference frequency signal F_REF increases, the bandwidth of a PLL can be freely established and the noise in the output signal F_OUT can be reduced. Accordingly, the value of $2^N-1$ has to be increased.

Here, the modulation waveform of FIG. 16 is merely an example. Accordingly, in order to maximize a modulation efficiency, the maximum value MSTEPMAX and the minimum value MSTEPMIN of the modulation step data MSTEP have to be established at a minimum value. In FIG. 16, the maximum value MSTEPMAX and the minimum value MSTEPMIN of the modulation step data MSTEP is established as 1, thereby maximizing a modulation efficiency.

Here, at least 16 signals having different phases during one period, i.e., 1/(T_F_REF*32), of a modulation frequency are required. Accordingly, the phase interpolator 1115 must generate more than 16 signals.

Therefore, an equation of $(2^N-1)>16$ can be derived, wherein N as the number of the switching control signals S_CON becomes more than 5. If the VCO 1110 generates the 16 signals having different phases while not using a phase interpolator 1115, the VCO 1110 needs eight differential amplifiers. The increase of the number of the differential amplifiers causes power dissipation and limits the establishment of the bandwidth of a PLL.

The above-described embodiments are merely examples of the present invention and various modulation methods using phase difference can be used according to the kinds of phase interpolators 1115.

As described above, according to the present invention, the PLL for reducing the EMI not only reduces the EMI but also does not require a ROM. Therefore, layout space can be reduced and broad frequency ranges can be obtained. In addition, since the phase difference of the output signals of the VCO is controlled by logic circuits, the PLL is insensitive to changes in the manufacturing process.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A phase locked loop (PLL) for reducing electromagnetic interference (EMI) comprising:
   a pre-divider for generating a reference frequency signal by dividing the signal inputted to the PLL by a pre-defined value;
   a phase detector for receiving the reference frequency signal and a feedback signal, detecting the phase difference between the two signals, generating a control signal depending on the detected phase difference and outputting a control voltage generated as a result of processing of the control signal by a pre-defined process;
   a voltage controlled oscillator (VCO) for receiving the control voltage and multiple switching control signals, and outputting a first oscillation signal having a pre-defined frequency in response to the control voltage while outputting a second oscillation signal which is delayed by as much as n-times (where n is an integer) the basic delay time of the first oscillation signal, in response to the multiple switching control signals;
   a main divider for receiving the second oscillation signal and outputting the feedback signal that commands the increase or decrease of the frequency of the first oscillation signal;
   a modulation control block for receiving modulation frequency data, modulation rate data, the feedback signal, and the second oscillation signal, and outputting the multiple switching control signals; and
   a post-divider for receiving the first oscillation signal and outputting signals by dividing the first oscillation signal by a pre-defined value.

2. The PLL of claim 1, wherein the basic delay time can be calculated by dividing one cycle of the first oscillation signal by the number of multiple switching control signals.

3. The PLL of claim 1, wherein the pre-defined process of the phase detector means a charge pumping and a loop filtering performed on the control signal.

4. The PLL of claim 1, wherein the modulation control block comprises:
   a modulation frequency control block for outputting a first modulation signal in response to the feedback signal, a modulation frequency data, and a selection signal;
   a modulation rate control block for outputting the selection signal and a second modulation signal in response to the feedback signal, the modulation rate data, and the first modulation signal; and a decision block for outputting multiple switching control signals in response to the feedback signal, the second oscillation signal and the second modulation signal.

5. The PLL of claim 1, wherein the VCO comprises:

a ring oscillator for outputting the first oscillation signal having a pre-defined frequency in response to the control voltage and for outputting multiple modulation oscillation signals which lead or are delayed by as much as the time calculated after one cycle of the first oscillation signal is divided by the number of multiple switching control signals;

a register block for including multiple registers that store multiple modulation oscillation signals;

multiple switches for selecting and switching one of the multiple modulation oscillation signals stored in the register block, in response to the multiple switching control signals; and an output buffer for buffering and outputting the signal inputted through one switch selected among the multiple switches.

6. A phase locked loop (PLL) for reducing electromagnetic interference (EMI) comprising:

a clock generator block for receiving input signals, generating a reference frequency signal, generating a control voltage corresponding to the phase difference between the reference frequency signal and a feedback signal, generating a first oscillation signal in response to the control voltage and a second oscillation signal which is delayed by as much as n-times (where n is an integer) the basic delay time of the first oscillation signal, in response to the multiple switching control signals; and a modulation control block for receiving modulation frequency data, modulation rate data, the feedback signal, and the second oscillation signal and outputting multiple switching control signals.

7. The PLL of claim 6, wherein the basic delay time can be calculated by dividing one cycle of the first oscillation signal by the number of the multiple switching control signals.

8. The PLL of claim 6, wherein the modulation control block comprises:

a modulation frequency control block for outputting a first modulation signal in response to the feedback signal, modulation frequency data, and the selection signal;

a modulation rate control block for outputting the selection signal and a second modulation signal in response to the feedback signal, the modulation rate data, and the first modulation signal; and a decision block for outputting multiple switching control signals in response to the feedback signal, the second oscillation signal, and the second modulation signal.

9. The PLL of claim 6, wherein the clock generator block comprises:

a ring oscillator for outputting the first oscillation signal in response to the control voltage, and multiple modulation oscillation signals which lead or are delayed by as much as the time calculated after one cycle of the first oscillation signal is divided by the number of multiple switching control signals;

a register block for including multiple registers that store multiple modulation oscillation signals;

multiple switches for selecting and switching one of the multiple modulation oscillation signals stored in the register block depending on the multiple switching control signals; and an output buffer for buffering and outputting the signal inputted through one switch selected among the multiple switches.

10. A phase locked loop (PLL) for reducing electromagnetic interference (EMI) comprising:

a phase detection and filter unit for comparing the phase of a predetermined reference frequency signal with the phase of a predetermined feedback signal to generate a control voltage having a value variable according to the difference of phases;

a voltage controlled oscillator (VCO) for generating a first oscillation signal having a frequency variable in response to the control voltage and first through $M^{th}$ clock signals having frequencies variable in response to the control voltage;

a phase interpolator for receiving the first through $M^{th}$ clock signals, dividing the phase difference between two sequential clock signals of the first through $M^{th}$ clock signals in response to predetermined first through $N^{th}$ switching control signals, and generating a second oscillation signal having a frequency as much as n-times (where n is an integer) a predetermined basic delay time;

a modulation control block for receiving modulation frequency data, modulation rate data, modulation step data, the feedback signal, and the second oscillation signal to output the first through $N^{th}$ switching control signals; and a main divider for receiving the second oscillation signal to output the feedback signal that indicates the increase or decrease of the frequency of the first oscillation signal.

11. The PLL of claim 10, wherein the basic delay time is formed by dividing one period of the first oscillation signal by $2^N-1$, wherein N is the number of the switching control signals.

12. The PLL of claim 10, further comprising:

a pre-divider for outputting the reference frequency signal formed by dividing an input signal by a predetermined value; and a post-divider for outputting a signal formed by dividing the first oscillation signal by a predetermined value.

13. The PLL of claim 10, wherein the modulation control block includes:

a modulation frequency control block for outputting a selection signal that selects the increase or decrease of a modulation rate in response to the feedback signal and the modulation frequency signal; and a modulation rate control block for outputting the first through $N^{th}$ switching control signals in response to the feedback signal, the modulation rate data, the second oscillation signal, the modulation step data, and the selection signal.

* * * * *